(12) United States Patent
Micallef

(10) Patent No.: US 7,999,447 B2
(45) Date of Patent: Aug. 16, 2011

(54) PIEZOELECTRIC DEVICE EMPLOYING ELASTOMER MATERIAL

(76) Inventor: Joseph Anthony Micallef, Chevy Chase, MD (US)

( * ) Notice: Subject to any disclaimer, the term of this patent is extended or adjusted under 35 U.S.C. 154(b) by 0 days.

(21) Appl. No.: 12/916,556

(22) Filed: Oct. 31, 2010

(65) Prior Publication Data

US 2011/0085284 A1    Apr. 14, 2011

Related U.S. Application Data

(60) Division of application No. 12/061,749, filed on Apr. 26, 2008, now Pat. No. 7,859,171, which is a continuation-in-part of application No. 11/849,326, filed on Sep. 3, 2007, now Pat. No. 7,755,257.

(51) Int. Cl.
*H01L 41/107* (2006.01)
*H01L 41/08* (2006.01)

(52) U.S. Cl. ............ 310/339; 310/328; 310/314

(58) Field of Classification Search ......... 310/339
See application file for complete search history.

(56) References Cited

U.S. PATENT DOCUMENTS

| 7,443,087 B2 * | 10/2008 | Hattori et al. ............... 310/311 |
| 7,705,523 B2 * | 4/2010 | Wang et al. ............... 310/339 |
| 2009/0121585 A1 * | 5/2009 | Lee et al. ............... 310/319 |
| 2010/0066208 A1 * | 3/2010 | Choi et al. ............... 310/339 |
| 2010/0253184 A1 * | 10/2010 | Choi et al. ............... 310/339 |
| 2010/0294976 A1 * | 11/2010 | Ajayan et al. ......... 252/62.9 PZ |

FOREIGN PATENT DOCUMENTS

| EP | 322899 A2 * | 7/1989 |
| GB | 2040642 A * | 8/1980 |
| JP | 63131700 A * | 6/1988 |
| JP | 63212873 A * | 9/1988 |
| JP | 2002184430 A * | 6/2002 |
| JP | 2002203585 A * | 7/2002 |
| JP | 2005216743 A * | 8/2005 |

* cited by examiner

*Primary Examiner* — J. SanMartin

(57) ABSTRACT

An elastomeric piezoelectric ultracapacitor embodiment is also disclosed. A dielectric elastomer is a polymer that may be configured to operate in a "generator mode." In generator mode the dielectric elastomer operates like a variable capacitor, and amplifies the energy of charge placed on a pair of compliant electrodes, formed on opposite sides of the elastomer, when the elastomer is in a compressed state. An elastomeric piezoelectric ultracapacitor employs generator mode techniques to further increase the power generation capabilities of an piezoelectric ultracapacitor.

20 Claims, 16 Drawing Sheets

US 7,999,447 B2

PIEZOELECTRIC DEVICE EMPLOYING ELASTOMER MATERIAL

This application is a divisional application of application Ser. No. 12/061,749, filed Apr. 26, 2008 now U.S. Pat. No. 7,859,171, which was a continuation-in-part of application Ser. No. 11/849,326, filed Sep. 3, 2007 now U.S. Pat. No. 7,755,257, each of which is hereby incorporated by reference in its entirety for all purposes.

BACKGROUND OF THE INVENTION

The generation of energy is a substantial concern to governments, individuals and research bodies around the world because of the difficulty in securing sufficient fuels to meet rising energy demand and the many environmental hazards associated with the generation of power and the acquisition of fuel stocks. One need only consider the Middle East or the tailpipe of an automobile to begin to appreciate the problems involved with the current approach to energy generation.

Many have attempted to develop acceptable alternatives to fossil or nuclear fuels, with limited success. Solar, wave and wind energy systems, for example, provide mechanisms by which electrical energy can be generated without the use of fossil fuels, but these techniques suffer both from being subject to the variability of the weather and economically marginal efficiencies as a replacement to fossil fuels. Similarly, techniques for making fuel from renewable biological sources, such as ethanol from corn or sugar cane, have been developed, but present difficulties of their own, including the diversion of agricultural land from food production and relatively limited energy production. Fusion, of course, is yet another energy generation technique that holds great promise, but that promise is far in the future and is unlikely to be realized in a practical way for many decades, if ever.

What would be ideal, and is needed, is an energy generation technology employing an abundant input, providing potentially significant energy output, avoiding environmental hazards and which is readily deployable.

SUMMARY OF THE INVENTION

These and other needs are satisfied by the present invention, which employs a piezoelectric ultracapacitor to harness efficiently the energy in physical motion, such as walking, driving or vibrating. While some have attempted in the past to use piezoelectrics for energy generation, the extremely small electrical current piezoelectric materials are capable of producing have limited those efforts. Ultracapacitors, of course, have been known and used in various contexts for energy storage. They have not, to the inventor's knowledge, been used for energy generation purposes. The combination of piezoelectric and ultracapacitor technologies, particularly in the combinations described as examples herein, provides extraordinary efficiencies in the conversion of movement to electricity.

Moreover, the current invention may be used in conjunction with other power generation technologies, such as fuel cells and solar cells, to increase the efficiencies of those technologies. For example, the piezoelectric ultracapacitors of the present invention may be coupled to the electrodes of a fuel cell, creating an electric potential across them and lowering the activation energy necessary to invoke the chemical reactions at the heart of the fuel cell.

As disclosed herein, multiple piezoelectric ultracapacitors may be coupled together in such a manner as to create an output voltage that is substantially the sum of their individual output voltages. Moreover, many different materials may advantageously be employed in the construction of piezoelectric ultracapacitors, including electrolytic gels, expanded conductive grids and activated carbon electrode structures.

An elastomeric piezoelectric ultracapacitor embodiment is also disclosed. An elastomer is a polymer that exhibits the characteristic of elasticity. It has been known for some time that dielectric elastomers may be configured to operate in a "generator mode." In generator mode the dielectric elastomer operates like a variable capacitor, and amplifies the energy of charge placed on a pair of compliant electrodes, formed on opposite sides of the elastomer, when the elastomer is in a compressed state. See, for example, R. Pelrine et al., "Dielectric Elastomers: Generator Mode Fundamentals And Its Applications", Smart Structures and Materials 200, EAPAD, vol. 4329, pp. 148-156, 2001, all parts of which are hereby incorporated by reference for all purposes. Dielectric elastomers operated in a generator mode, however, do not themselves create energy. Rather, they merely amplify energy placed on the dielectric elastomer when it is in a compressed state. An elastomeric piezoelectric ultracapacitor employs generator mode techniques to further increase the power generation capabilities of an piezoelectric ultracapacitor.

DETAILED DESCRIPTION

Figure 1:
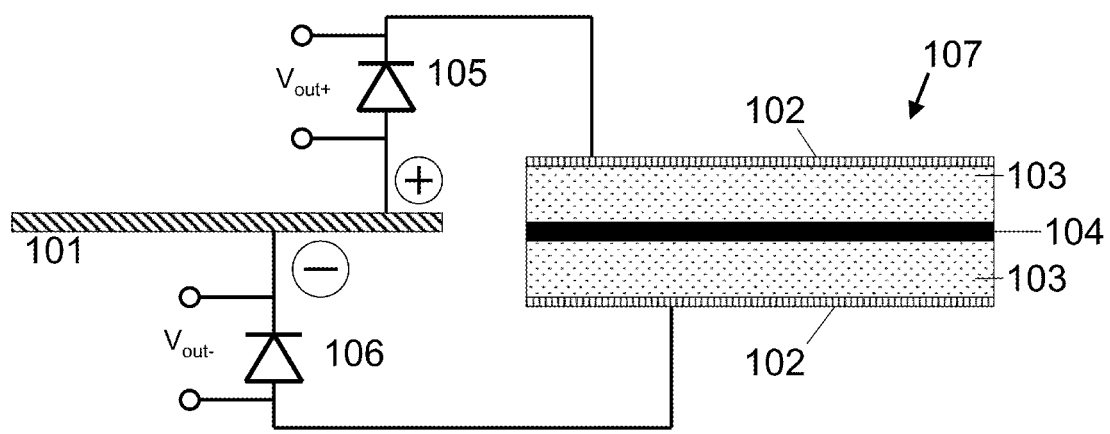
FIG. 1 depicts a first embodiment of a piezoelectric ultracapacitor employing the principles of the invention.

Referring to FIG. 1, piezoelectric element 101 is coupled to ultracapacitor 107 through diodes 105 and 106. Piezoelectric element 101 can be formed of one or more portions of any suitable piezoelectric material, such as polyvinylidene difluoride (known as "PVDF") or lead zirconate titanate (often referred to as "PZT"). The invention is not limited to the use of these materials, though it is believed that the flexible nature of these two piezoelectric materials provides some protection from cracking or other damage during use. Flexible piezoelectric materials are therefore preferred.

Moreover, experiments have shown that the power generation capabilities are not greatly enhanced by the use of PZT (which is inherently capable of creating higher voltages than PVDF); PVDF is therefore preferred due to its lower cost. Such materials are known and commercially available from many different sources. PVDF, for example, is available commercially under the trade names KYNAR® and KYNAR FLEX® by Arkema, Inc. of Philadelphia, Pa.

In this and other embodiments that follow diodes are described as coupling the piezoelectric element to electrodes of the ultracapacitor. However, other coupling mechanisms, such as FET or BJT transistors, can be employed within the scope of the invention. Indeed, in many applications the use of transistors instead of diodes may be preferred because of the switching capability they provide.

Ultracapacitor 107 is formed from electrodes 102, formed for example from aluminum, electrolyte materials 103, such as cotton cloth or other material impregnated with an electrolytic solution (a solution of sodium chloride in water, for example), and barrier 104, which can be a proton conductor such as NAFION™, a commercially available proton conductive membrane manufactured by the DuPont Company of Wilmington, Del. and distributed by Ion Power, Inc. of New Castle, Del. Ultracapacitors have been known for some time, and appear to have been invented at the General Electric Company in the late 1950's. See, for example, U.S. Pat. No. 2,800,616, the entirety of which is hereby incorporated by reference. The principles of their operation are therefore well-known to the art and will not be further explained here.

It should be noted, however, that modern ultracapacitors often employ a proton conductive barrier, such as the aforementioned NAFION™, but such a barrier is not necessary to the formation of an ultracapacitor. It has been found that such a barrier is not necessary for implementation of the present invention either and indeed adds only a small amount of added efficiency. Thus, while some of the embodiments of the invention are here described as including such a barrier/membrane, it should be recognized that such a barrier is not a requirement of the invention except where specifically and expressly called for by the claims appended hereto.

Referring again to FIG. 1, in operation, forces exerted on the piezoelectric element 101, from vibrations or other movements, induce a voltage across the surfaces of element 101, which is applied to the ultracapacitor through the coupling shown. Such voltages can be substantial though, as noted above, the current created by piezoelectric materials is quite small, due to the extremely high input impedance of the piezoelectric material. Nevertheless, the voltage causes a charge to accumulate on the electrodes of the ultracapacitor, charge that is prevented from returning to the piezoelectric element or otherwise being neutralized by diodes 105 and 106.

Charge accumulated on the electrodes 102 of the ultracapacitor cause an opposite charge to accumulate at the interface of the electrolytic materials and the electrodes. Charge carriers in an electrolyte are ions, not electrons, so they are incapable of traveling through the metal structure of the electrodes. Instead, the interface between the electrode and the electrolyte, on each side of the ultracapacitor 107 (i.e., the bottom and top as shown in the figure) acts as a highly dense capacitor capable of storing a very large amount of energy. That energy can be drained off, either for storage in another circuit element, such as a battery (not shown), or for purposes of performing some work. Output nodes are also shown across each of the diodes 105 and 106, across which Vout+ and Vout−, respectively, can be obtained.

Figure 2:
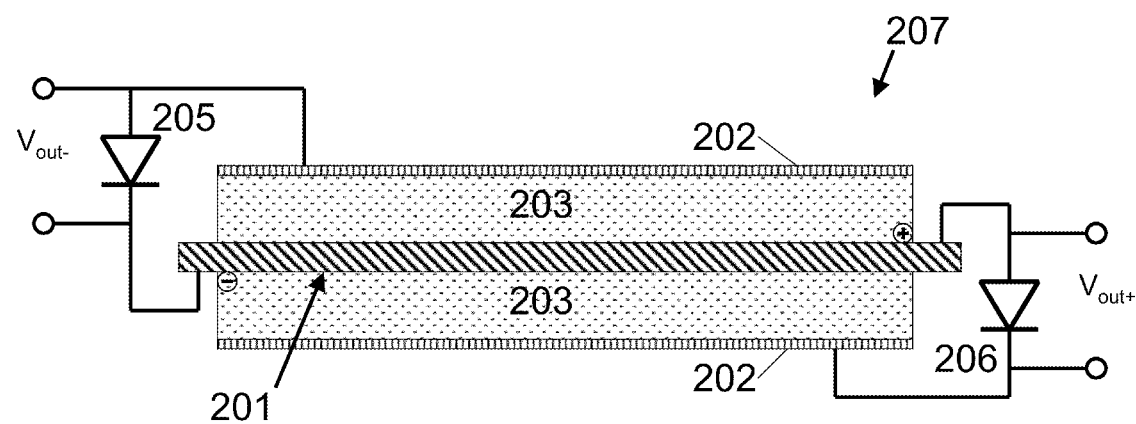
FIG. 2 depicts a second embodiment of a piezoelectric ultracapacitor employing the principles of the invention.

Referring now to FIG. 2, there is shown a second embodiment, 207, of a piezoelectric ultracapacitor employing the principles of the invention. There, piezoelectric element 201 forms the center barrier of piezoelectric ultracapacitor 207, and is coupled to electrodes 202 through diodes 205 and 206. Electrodes 202 are similar to electrodes 102 described in connection with FIG. 1. Electrolyte materials 203, which separate piezoelectric element 201 from electrodes 202, are also similar to electrolyte materials 103 described in connection with FIG. 1.

The positive and negative faces of the element 201 are indicated in the figure (as they are in the other figures as well). Those of ordinary skill in the art will understand that the proper coupling of diodes 205 and 206 depends on which face of the piezoelectric element the diode is being coupled to. Thus, diode 205 is coupled to the negative face of the piezoelectric through its cathode and diode 206 is coupled to the positive face of the piezoelectric through its anode. Similar couplings are depicted in each of the figures.

The operation of the embodiment shown in FIG. 2 is also similar to the operation of the embodiment shown in FIG. 1, though with some differences. More specifically, forces exerted on piezoelectric ultracapacitor 207, and thereby on piezoelectric element 201, induce a voltage across the surfaces of element 201, which voltage is applied to the electrodes 202 through the coupling shown, including diodes 205 and 206. The voltage causes a charge to accumulate on the electrodes of the ultracapacitor, charge that is prevented from returning to the piezoelectric element or otherwise being neutralized by diodes 205 and 206.

As with the embodiment of FIG. 1, charge accumulated on the electrodes 202 of the ultracapacitor 207 causes an opposite charge to accumulate in the electrolytic materials at the interface of those materials with the electrodes, thereby again causing each interface to become a very dense capacitor.

Figure 3:
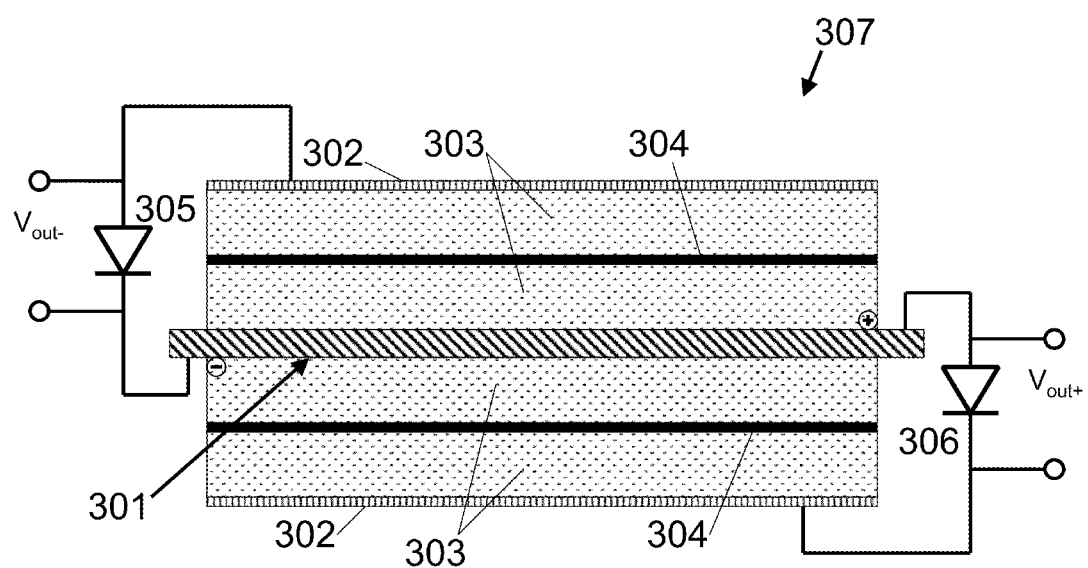
FIG. 3 depicts a third embodiment of a piezoelectric ultracapacitor employing the principles of the invention.

FIG. 3 depicts yet another embodiment of the invention. Specifically, there is shown piezoelectric ultracapacitor 307 having piezoelectric element 301 that forms the center barrier of piezoelectric ultracapacitor 307, and is coupled to electrodes 302 through diodes 305 and 306. Electrodes 302 are similar to electrodes 102 described in connection with FIG. 1. Electrolyte materials 303, which separate piezoelectric element 301 from electrodes 302, are also similar to electrolyte materials 103 described in connection with FIG. 1. Here, however, electrolyte materials 303 each comprise two electrolytic sub-materials separated by proton conductive membrane 304 to provide further separation of negative and positive ions in the electrolyte.

Figure 3A:
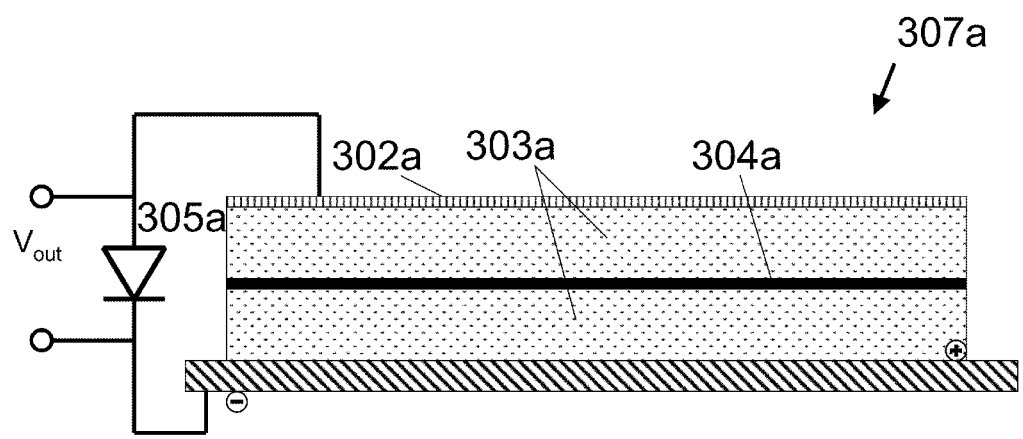
FIG. 3a depicts a modification of the embodiment of a piezoelectric ultracapacitor shown in FIG. 3, and therefore yet another embodiment.

It should be noted that the invention does not require formation of a two-sided ultracapacitor as shown in these figures. A one-sided ultracapacitor—for example, one including only the top half of FIG. 3—would also be encompassed by the invention. Such an embodiment is shown in FIG. 3a, and those of ordinary skill in the art will readily understand how to make and use a one-side ultracapacitor in the context of the other embodiments described herein.

Figure 4:
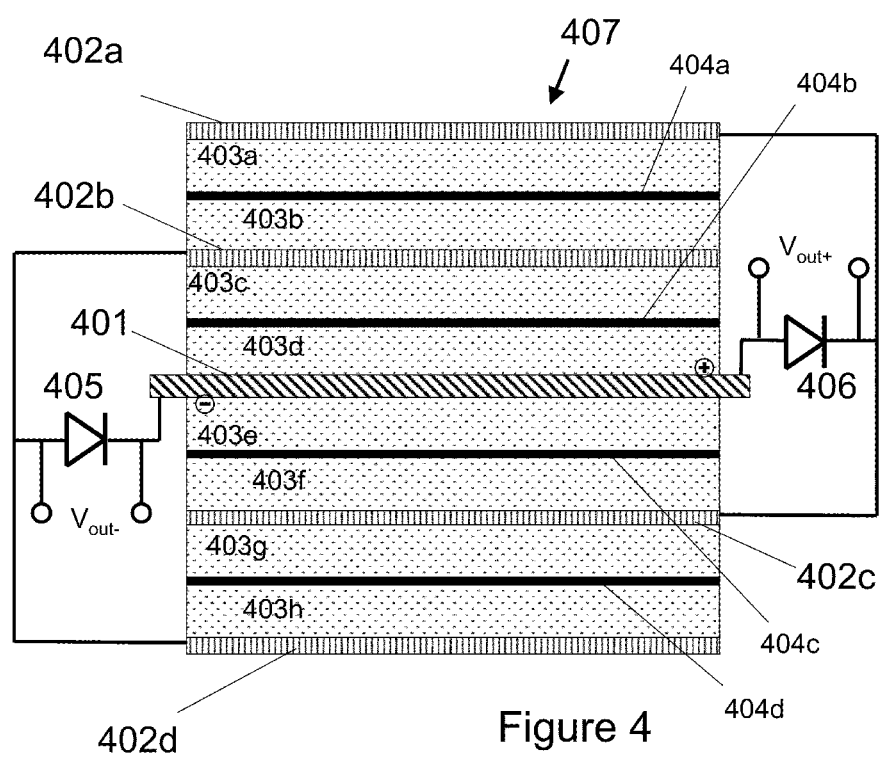
FIG. 4 depicts a fourth embodiment of a piezoelectric ultracapacitor employing the principles of the invention.

FIG. 4 depicts another embodiment, which is a modification of the embodiment shown in FIG. 3. Here, multiple ultracapacitive layers are formed above/below each face of the piezoelectric element. The piezoelectric ultracapacitive stack of this embodiment includes multiple electrolytic sub-layers, multiple electrode sub-layers and multiple proton conductive sub-layers. The same materials described above may be employed. Layers 402a and 402c are coupled together and to the cathode of a diode 406, and thereby to the positive face of piezoelectric element 401. Layers 402b and 402d are coupled together and to the anode of another diode 405, and thereby to the negative face of piezoelectric element 401.

Note that in such an embodiment diodes 405 and 406 are each coupled to multiple electrode layers in the stack. It is, of course, possible to employ multiple diodes coupled to each face of the piezoelectric—one per electrode for example. However, where the combined maximum voltage created on all electrodes coupled to a single face of the piezoelectric is less than the breakdown voltage of the diode, it is more efficient to employ just a single diode per piezoelectric face, as shown.

Figure 5:
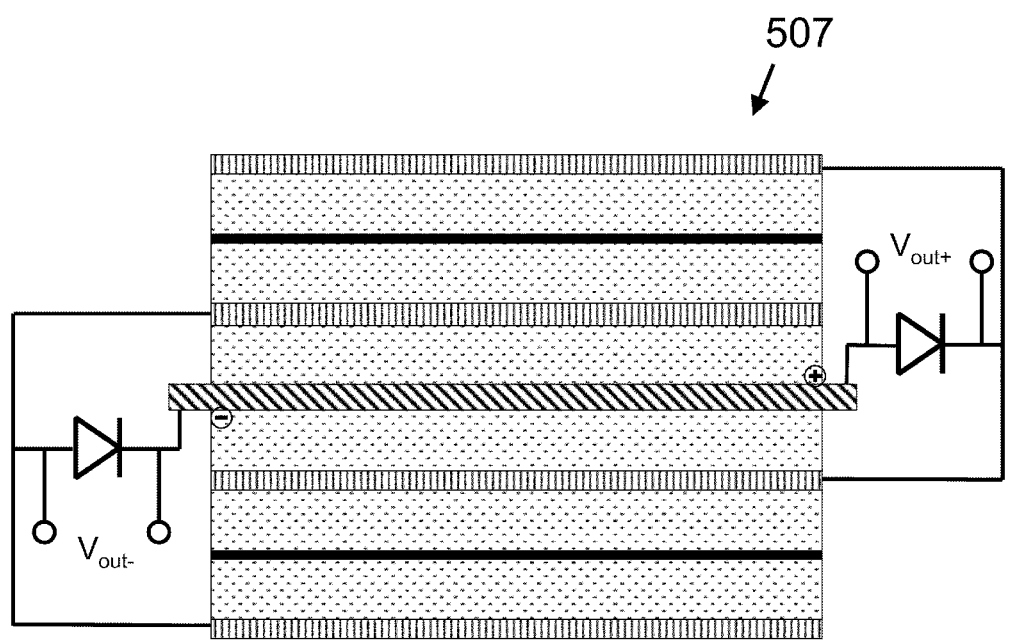
FIG. 5 depicts a fifth embodiment of a piezoelectric ultracapacitor employing the principles of the invention.

FIG. 5 depicts an embodiment similar to that of FIG. 4, but here the proton conductive layer is not included in the capacitive layers immediately adjacent to the piezoelectric element. Of course, the proton conductive layer could have been left out of the outer capacitive layers as well.

One important benefit of the structures described above is their ability to recharge themselves. Taking the structure of FIG. 2 as an example, once piezoelectric ultracapacitor 207 is charged to a maximum, that charge may be drained, as mentioned above, either to some energy storage mechanism, such as a battery or capacitor, or to perform some work. However, once drained the charge across each diode 205 and 206 returns, over the course of several seconds, without further intentional excitation or the connection of some other power source. It is believed that the piezoelectric element is constantly creating continually varying voltages due to the normal—though usually unnoticed—vibrations and other forces of ordinary life. Those voltages, though relatively small, induce concomitant voltages on electrodes 202 and, due to the semiconductive properties of diode 205 and 206, eventually charge the piezoelectric ultracapacitor 207 to a maximum level. In experiments using an embodiment that employed aluminum electrodes, cotton cloth impregnated with a sodium chloride solution for the electrolyte 203 and a PZT element at the core, it was observed that recharging of each side of the piezoelectric ultracapacitor to about 0.3V occurred in about 3 seconds. A comparable capability was observed in an embodiment similar to that of FIG. 2 and employing a PVDF core.

Figure 6:
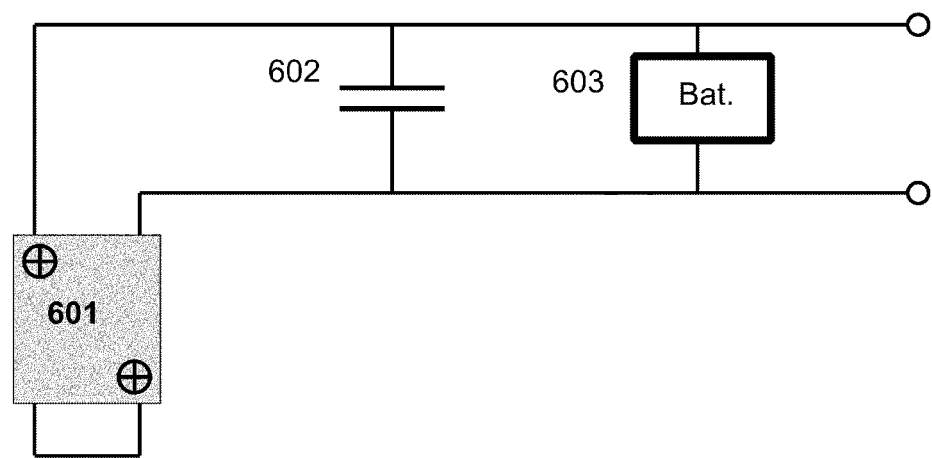
FIG. 6 depicts a circuit for storing energy generated by one or more piezoelectric ultracapacitors coupled thereto.

Referring now to FIG. 6, a circuit for storing energy generated by one or more piezoelectric ultracapacitors is depicted. Element 601 represents one or more piezoelectric ultracapacitors, such as the array of piezoelectric ultracapacitors described above. Element 601 is coupled to capacitor 602, which is itself coupled to rechargeable battery 603. Battery 603 can be of any conventional rechargeable battery, such as a NIMH battery. Other types of batteries may also be used, though some rechargeable batteries—lithium-based batteries for example—may require additional circuitry, known to those of ordinary skill in the art, to condition the voltage for the battery. Each of capacitor 602 and battery 603 separately, as well as both considered together, constitute an energy storage circuit. Such circuits may be used to store energy for use by an external device (not shown).

Several basic embodiments of the piezoelectric ultracapacitor of the present invention have been described above. However, there are a number of optional modifications that can be made to one or more of those embodiments. For example, a polymer gel electrolyte, either alone or by impregnating a carrier layer (made of, for example, felt), can be disposed between the piezoelectric core and one or more of the electrodes.

There are several known methods of preparing such gel electrolytes. For example, they can be manufactured through the dissolution of a polymer in a solvent, followed by the addition of a plasticizer, the casting of the mixture as a film, the removal of the solvent through heat or ultraviolet radiation and the addition of an electrolyte. Another method includes mixing a reactive monomer, a liquid electrolyte and a radical initiator to form a precursor solution. The precursor solution is then cured by heat or ultraviolet radiation.

Suitable polymers include PVDF, PVDF-HFP, polymethylacrylate, polyethylene oxide or others. Suitable solvents include carbonate solvents, such as dimethyl carbonate, diethyl carbonate, propylene carbonate, ethylene carbonate or a mixture of solvents. Suitable electrolyte can be made from the ionic salts of lithium, such as $LiAsF_6$, $LiPF_6$, $LiBF_4$, $LiClO_4$, or a combination of such salts. The techniques for preparing such electrolyte gels are known—see for example U.S. Pat. Nos. 6,080,282 and 6,841,303, the entirety of both of which are incorporated herein for all purposes. Similarly, more simple conductive electrolyte gels may be used, such as SIGNA® electrode gel, available from Parker Laboratories, Inc. of Fairfield, N.J.

Electrodes for the piezoelectric ultracapacitor may be formed of any structure that performs the function of capacitively coupling to the electrolyte material. For example, such electrodes may be formed from an expanded metal foil structure of aluminum, copper or other conductive material. Such materials are available commercially, for example from Dexmet Corporation of Naugatuck, Conn. under the tradename MICROGRID®. Such electrodes may also be formed of, or include, a layer of activated carbon paper, activated carbon fabric or a combination of either with a conductive current collector made from, for example, one of the MICROGRID® structures referred to above. Electrodes may also be formed of, or include, carbon nanotube electrodes (sometimes referred to in the art as "CNT electrodes") produced by, for example, a chemical vapor deposition process. Any of these electrode structures will provide an appropriate capacitive coupling to the electrolyte.

Use of aluminum MICROGRID® electrodes is presently preferred. Indeed, use of aluminum Microgrid electrodes at both the anode and cathode provides better results than any other configuration. This is surprising, since it is common practice in the fabrication of conventional ultracapacitors to employ one aluminum current collector at the positive electrode and one copper current collector at the negative electrode, both in combination with activated carbon paper or fabric. In the piezoelectric ultracapacitive context, however, it has been found that such a configuration, while operable, provides a smaller voltage than the use of dual aluminum mesh electrodes.

As noted above, coupling mechanisms between one face of the piezoelectric core and one electrode other than the diodes depicted in some of the drawings discussed above may be advantageously employed. It has been found that capacitors and even conventional ultracapacitors may be used for this purpose. However, simple resistors also appear to be useful. Other circuit components may also be used and remain within the scope of the invention.

Figure 2A:
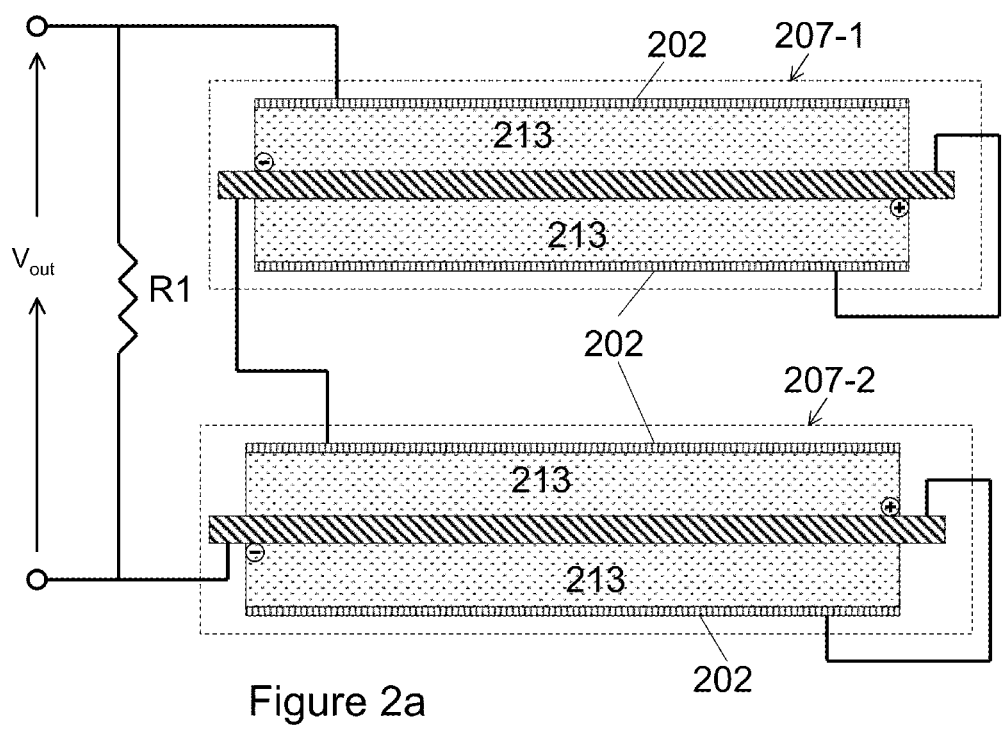
FIG. 2a depicts a configuration comprising multiple piezoelectric ultracapacitors.

It has also been found that the voltages of individual piezoelectric ultracapacitors are additive when multiple piezoelectric ultracapacitors are coupled together appropriately. FIG. 2a shows one example of such a configuration involving two individual piezoelectric ultracapacitors, designated 207-1 and 207-2. Each such piezoelectric ultracapacitor includes polymer gel electrolyte 213 between MICROGRID® aluminum electrodes 202 and a piezoelectric core. Each piezoelectric ultracapacitor has one face of its piezoelectric core directly coupled to the electrode opposite the other face of the piezoelectric core. The positive face of one piezoelectric core is coupled to the electrode opposite the negative face of the other piezoelectric ultracapacitor's core. Thus, the anode of one piezoelectric ultracapacitor is coupled to the cathode of a second piezoelectric ultracapacitor.

The output Vout is then taken, in this example, across a resistor R1 that spans the negative face of the second piezoelectric ultracapacitive core and the electrode opposite the negative face of the first piezoelectric ultracapacitive core. (The resistor R1 may preferably be of about 10 k ohms or larger. Some other coupling mechanism, such as a diode, transistor or capacitor, may instead be used.) It has been found that the output Vout is substantially equal to the sum of the output voltages that the two piezoelectric ultracapacitors 207-1 and 207-2 would have produced if each had been deployed in the isolated configuration shown in FIG. 2.

Figure 2B:
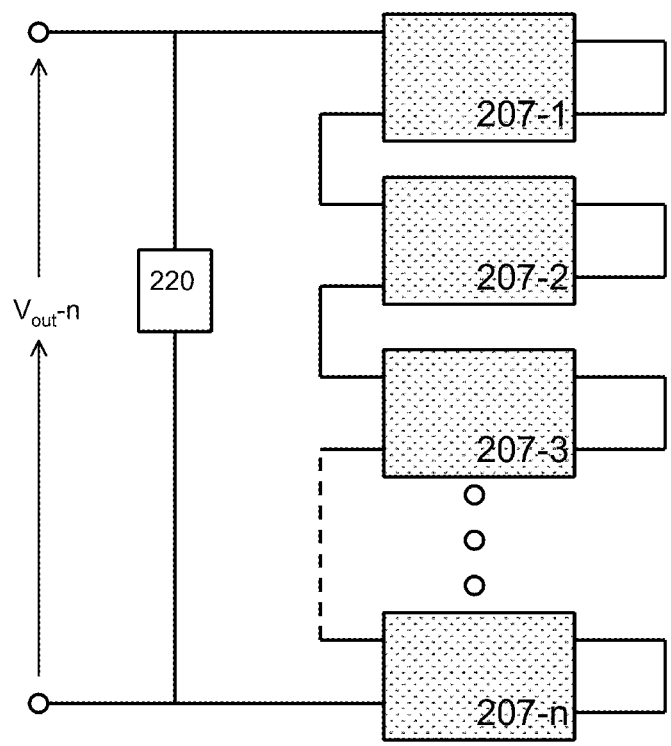
FIG. 2b depicts another configuration comprising multiple piezoelectric ultracapacitors.

Note that this technique is not limited to the coupling of only two piezoelectric ultracapacitors, but can be used to add the output voltages of a plurality of N piezoelectric ultracapacitors even greater than two, as shown in FIG. 2b for example, in which coupling mechanism 220 can be, for example, any of the aforementioned circuit elements for performing that circuit function, including but not limited to a resistor, diode, capacitor or transistor. Such configurations of multiple piezoelectric ultracapacitors can also be employed to charge one or more energy storage devices. For example, in the example of FIG. 6, element 601 could also be a plurality of piezoelectric ultracapacitors configured in the manner described in FIGS. 2a and 2b. Such a configuration provides the advantage of creating a much higher voltage than would otherwise be created by a single piezoelectric ultracapacitor.

Figure 7:
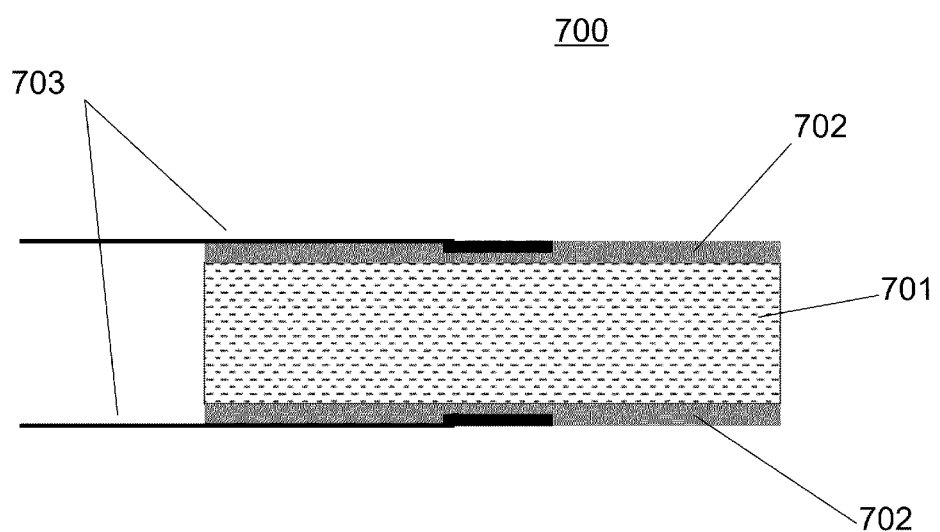
FIG. 7 depicts an example of a dielectric elastomer actuator.

Referring now to FIG. 7, there is depicted a dielectric elastomer actuator 1100 in a known form. Actuator 700 is formed by first providing, and if necessary shaping, dielectric elastomer material 701. Compliant electrodes 702 are then formed on the outer faces of material 701 and couplings 703 applied.

Compliant electrodes are electrodes whose mechanical properties are compatible with the mechanical properties of the elastomer to which they are coupled. They may be formed as part of the elastomer material itself—for example, by mixing a conductive material, such as graphite or carbon black, with a portion of an elastomer (such as silicone or acrylic) in a liquid or gel-like state and then permitting the mixture to dry. In that example, the conductive portion of the elastomer (i.e., the portion mixed with the graphite) would be the electrode and would be coupled to the non-conductive portion of the elastomer (i.e., the portion not mixed with the graphite). Alternatively, compliant electrodes may also be formed separately from the elastomer and attached to the elastomer. Certain conductive polymers, such as polypyrrole, may be used in this manner. Indeed, compliant electrodes may be formed of many different materials whose mechanical properties are compatible with the mechanical properties of the elastomer and that perform the function of conducting electricity, including, in addition to those mentioned above, conductive grease, carbon particles combined with a polymer binder such as silicone, or colloidal suspensions containing sub-micrometer sized particles, such as graphite, silver or gold, in a liquid vehicle. Formation of suitable compliant electrodes is known in the art and will not be further described here so as not to obscure the invention.

It is known that dielectric elastomer actuators can be operated in what is called "generator mode." In its most basic sense, generator mode is a mode of operation during which the dielectric elastomer actuator operates like a variable capacitor. More specifically, initially at rest with no force or charge applied, the actuator is configured with compliant electrodes on two opposing sides. The electrodes are compliant in that they will change shape with the elastomer. The elastomer is then subjected to a force that causes deflection in a direction normal to the compliant electrodes. (In FIG. 7, that would be in the vertical direction.) The thickness of the material in the direction the force is applied is thus reduced, causing the electrodes to come closer together. Moreover the area of the elastomer in the plane normal to the force, and the area of the compliant electrodes in that plane, consequently increases. At this point the device has a certain capacitance and is capable of storing a certain amount of energy, both quantities being a function in part of the device dimensions.

A voltage is then placed across the electrodes. When the force is released, the elastomer tends to return to its original shape and original dimensions, pushing the electrodes away from each other and reducing the area of the electrodes, thereby bringing the charged particles on one electrode further away from the particles of opposite charge on the other electrode and while also bringing the charged particles on each electrode closer to the particles of similar charge on the same electrode. This tends to increase the capacitance of the device and, consequently, the energy stored thereon. Thus, the dielectric elastomer with compliant electrodes, when operated in a generator mode, tends to amplify the energy placed on the electrodes when the device is in a charged state.

Note that it is not necessary to employ compliant electrodes to achieve this result, since non-compliant electrodes will still be brought further away from each other by the action of the elastomer, and the capacitance of, and therefore energy stored on, the device will thereby increase.

Figure 8:
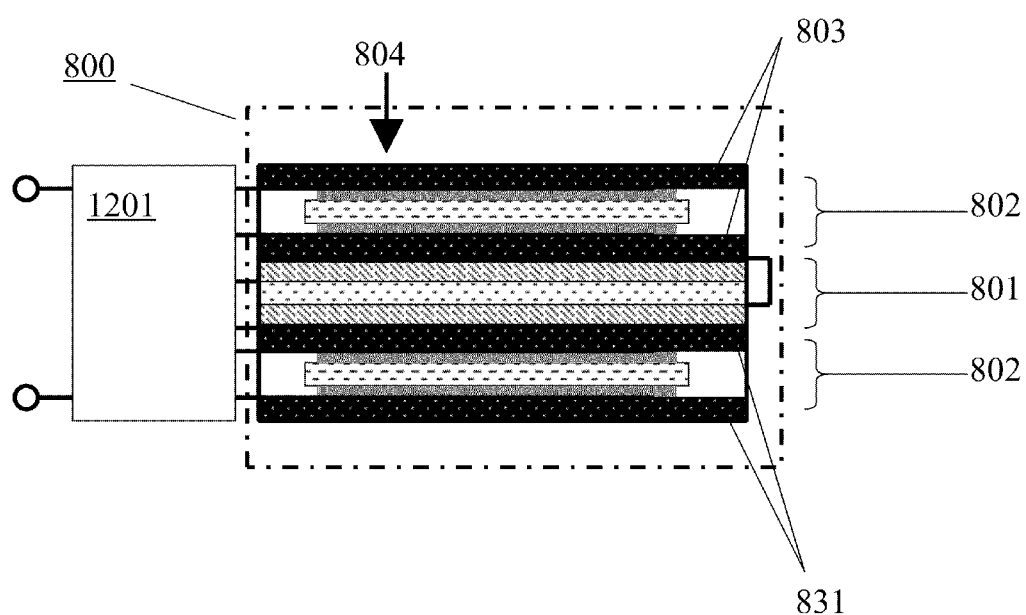
FIG. 8 depicts an example of an elastomeric piezoelectric ultracapacitor coupled to an energy harvesting circuit.

Referring now to FIG. 8, there is depicted an example of an elastomeric piezoelectric ultracapacitor 800. The piezoelectric ultracapacitor 801, such as one of the embodiments described above, is sandwiched between two dielectric elastomer actuators 802, formed in the manner outlined above, and each having at least one compliant electrode coupled thereto. It is not necessary to the invention, however, that compliant electrodes be employed.

Separators 803 may also be inserted as shown, though they are not necessary. Separators 803 are preferably formed of an insulating material such as a thin plastic or other polymer. The entire device is then coupled to output circuit 1201, which may for example include an energy storage element (such as a capacitor or a rechargeable battery) or circuitry for performing some type of work (such as a sensor or transmitter).

Elastomeric piezoelectric ultracapacitor 800 can be operated in generator mode by applying a force, or causing a force to be applied, in the direction of arrow 804. More specifically, as explained above, the piezoelectric ultracapacitor 801 creates a constant voltage, which is applied across the compliant electrodes of each of the actuators 802 through circuit 1201. When a force is applied along 804, the actuators 802 will be put into their compressed, or "deflected," state; that is, their vertical dimension (as shown in the Figure) will be compressed and their horizontal dimensions expanded, thus creating an enhanced capacitance. The force applied along 804, however, will also be applied through the actuators to piezoelectric ultracapacitor 801. Force applied to piezoelectric ultracapacitor 801 causes the voltage created by that device to increase, since generally piezoelectric material reacts to the application of a force by generating a voltage proportional to the force. That increased voltage will accordingly also be applied across the electrodes of each of the actuators through circuit 1201. When the force along 804 is released the actuators return to their original dimensions, or nearly so, and also to their original capacitance, thereby increasing the energy stored in the device. That additional energy is harvested by circuit 1201, and can be used to power an external device such as a sensor or transmitter (not shown) or stored in, for example, a rechargeable battery or capacitor (also not shown).

Actuators 802 can be formed of many different materials. Various suitable dielectric elastomers exist and are commercially available, including polymers such as VHB 4910 from 3M Corporation of St. Paul, Minn. Other suitable materials include NuSil CF19-2186 available from NuSil Technology of Carpenteria, Calif. and various other silicone elastomers, such as Dow Corning HS3 and Dow Corning 730 available from Dow Corning of Wilmington, Del. Such elastomer materials may also be pre-strained to increase their performance.

It should be noted that the invention does not require the "sandwich" configuration depicted in FIG. 8. In particular, one or more piezoelectric ultracapacitors may also be coupled to one or more actuators in a different physical configuration—side-by-side or in circular fashion to cite two such examples.

Figure 9:
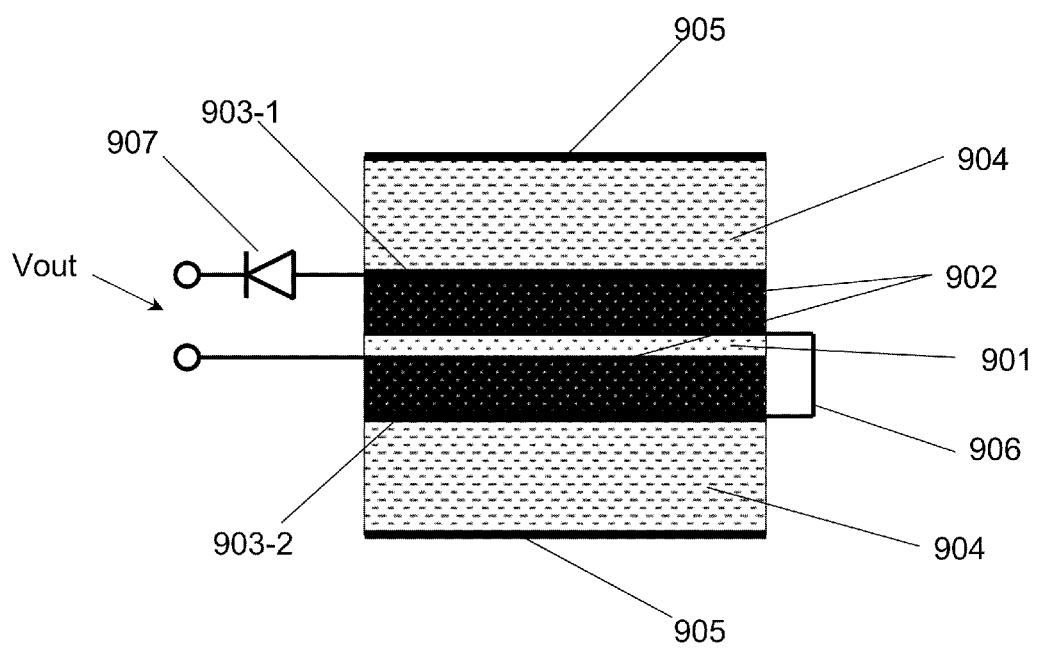
FIG. 9 depicts another example of an elastomeric piezoelectric ultracapacitor.

FIG. 9 depicts another embodiment of an elastomeric piezoelectric ultracapacitor. There, piezoelectric core 901 (for example, PVDF) is coupled to two electrolyte layers 902 (formed, for example, of a gel electrolyte). The gel electrolyte layers 902 are each coupled to an electrode 903 (formed, for example, of an aluminum MICROGRID® structure). Two elastomer layers 904 are each coupled to one of the piezoelectric ultracapacitor electrodes 903 and each is also coupled to another electrode 905. Each elastomer electrode 905 may comprise a non-compliant electrode (such as aluminum foil or mesh) or a compliant electrode (such as those described above).

Electrical coupling 906 connects one face of piezoelectric core 901 to a first electrode 903-2 opposite the other face of piezoelectric core 901. Output voltage Vout is taken across a second electrode 403-1 and the other face of piezoelectric core 901, as shown. Diode 907 may be used to prevent charge from returning to electrode 903-1. Additional circuitry, such as that of circuit 1201 in FIG. 8, may also be attached. (Note, however, that the output may also be taken across electrodes 905, though it is believed that such an output will not produce as high a voltage.)

Figure 10:
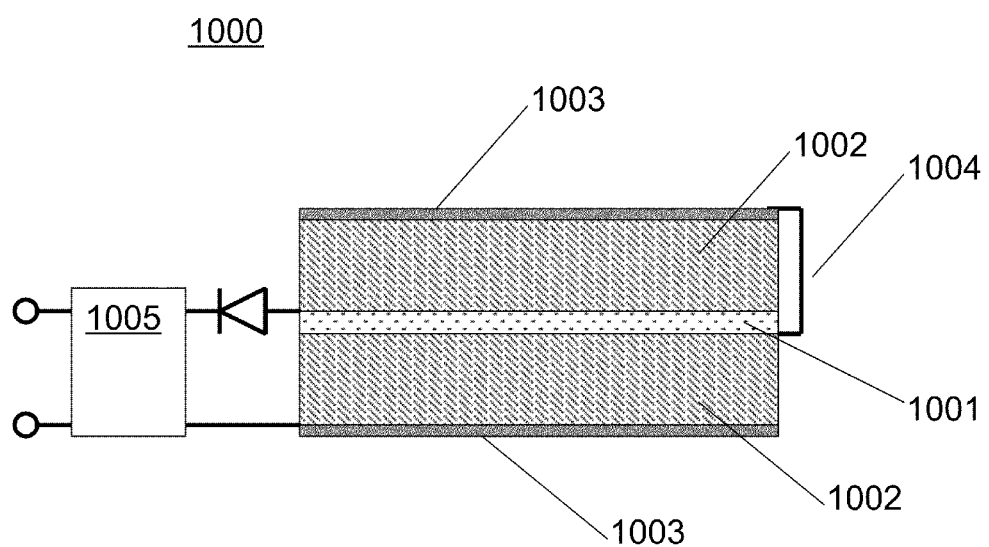
FIG. 10 depicts yet another example of an elastomeric piezoelectric ultracapacitor coupled to an output circuit.

Referring now to FIG. 10, there is depicted another alternative embodiment of an elastomeric piezoelectric ultracapacitor. Here, elastomeric piezoelectric ultracapacitor 1000 is formed by disposing two electrolyte elastomer gel layers 1002 so as to contact piezoelectric core 1001. The layers 1002 are thereby coupled to piezoelectric core 1001. The electrolyte elastomer gel layers 1002 may comprise, for example, a preparation of a plasticized propylene carbonate acrylate and a lithium salt, as is known. See, for example, Golden et al., Preparation of Propylene Carbonate Acrylate and Poly(propylene carbonate acrylate) Electrolyte Elastomer Gels, Macromolecules Vol. 28, No. 9, 1995, pp. 3468-3470, the entirety of which is incorporated herein by reference for all purposes. Lithium salts commonly used in the preparation of lithium-based gel electrolytes include $LiAsF_6$, $LiPF_6$, $LiBF_4$, $LiClO_4$, or a combination of such salts. Electrodes 1003 are then formed on each elastomer layer. One, both or neither of electrodes 1003 may be compliant electrodes. Coupling 1004 between one face of the piezoelectric core 1001 and electrode 1003 opposite the other face of core 1001 is optional.

Elastomeric piezoelectric ultracapacitor 1000 may then be operated in generator mode, substantially as described above, by for example applying a force vertically (i.e., normal to the electrodes), thereby creating an enhanced capacitance and voltage, then releasing the force, causing the capacitance of the device to diminish and a corresponding increase in energy, which can then be harvested by harvesting circuit 1005. Harvesting circuit 1005 may comprise a tank capacitor and a NIMH rechargeable battery, for example. Other harvesting circuits may also be used within the scope of the invention.

Figure 13:
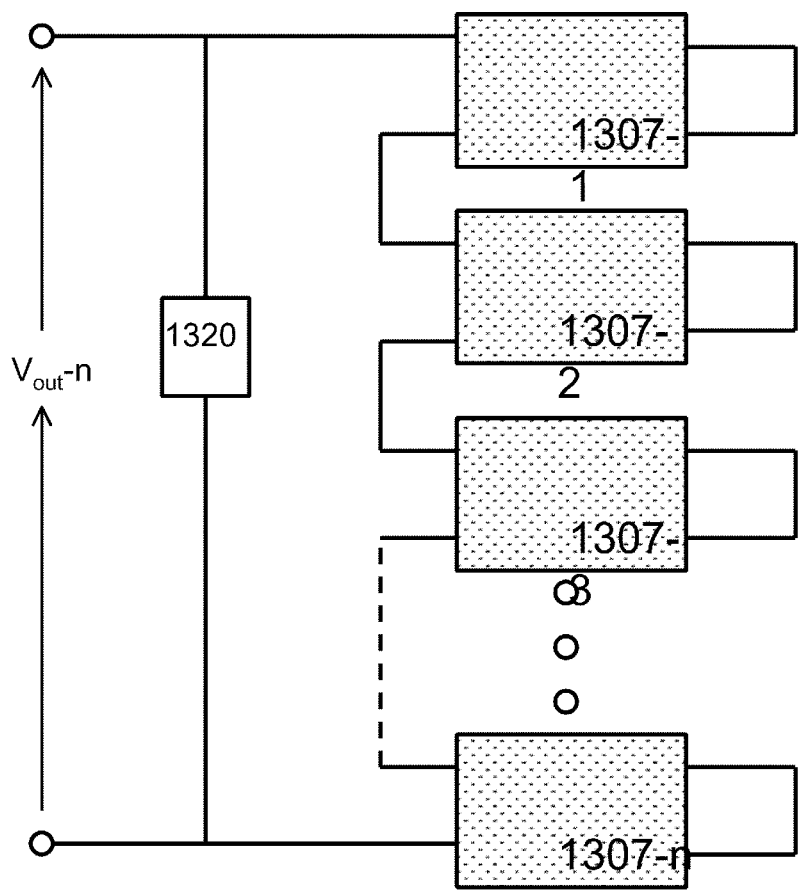
FIG. 13 depicts an example of an array of the elastomeric piezoelectric ultracapacitors of the present invention.

The elastomeric piezoelectric ultracapacitors of the present invention may also be coupled together in an array so as to add their output voltages together. This is done by connecting the anode of one to the cathode of another, as described above and depicted here in FIG. 13. In that Figure elastomeric piezoelectric ultracapacitors 1307-1 through 1307-n are coupled together and an output voltage is taken across all of them and an output circuit 1320 (such as a tank capacitor or other circuitry).

Note that the elastomeric piezoelectric ultracapacitors of the present invention, such as the embodiments of FIG. 8, 9 or 10, may be coupled to a capacitor and rechargeable battery, such as in the configuration shown in FIG. 6. In this example, however, element 601 represents one or more elastomeric piezoelectric ultracapacitors, rather than simply one or more piezoelectric ultracapacitors as described earlier with respect to that Figure.

Figure 11:
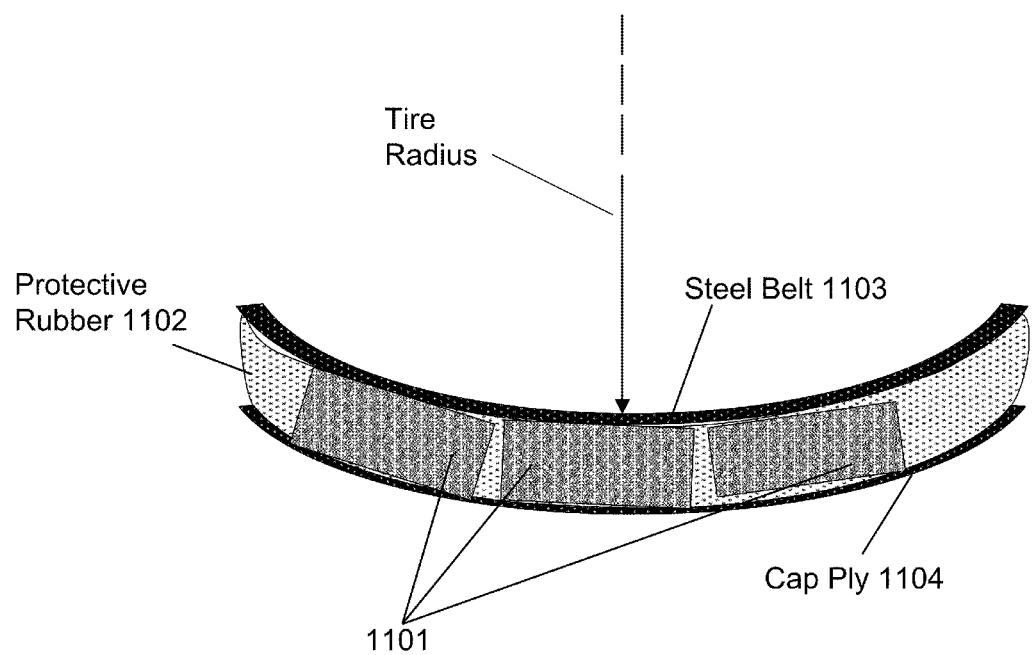
FIG. 11 depicts an example of a plurality of elastomeric piezoelectric ultracapacitors embedded in a tire.

One use of the elastomeric piezoelectric ultracapacitors of the present invention is as a power source for an electric bike, motorbike or automobile. One or more of the elastomeric piezoelectric ultracapacitors can be embedded in tire(s), for example, or placed in contact with axel/suspension structures. FIG. 11 shows a cutaway of a tire embodiment for automobile. There, several elastomeric piezoelectric ultracapacitors, or elastomeric piezoelectric ultracapacitors 1101 are embedded between the layers of an automobile tire, such as steel belt 1103 and cap ply 1104. They may also be embedded within a protective rubber layer 1102. A bus (not shown) embedded within the tire connects the elastomeric piezoelectric ultracapacitors to additional circuitry to be described below.

Figure 12:
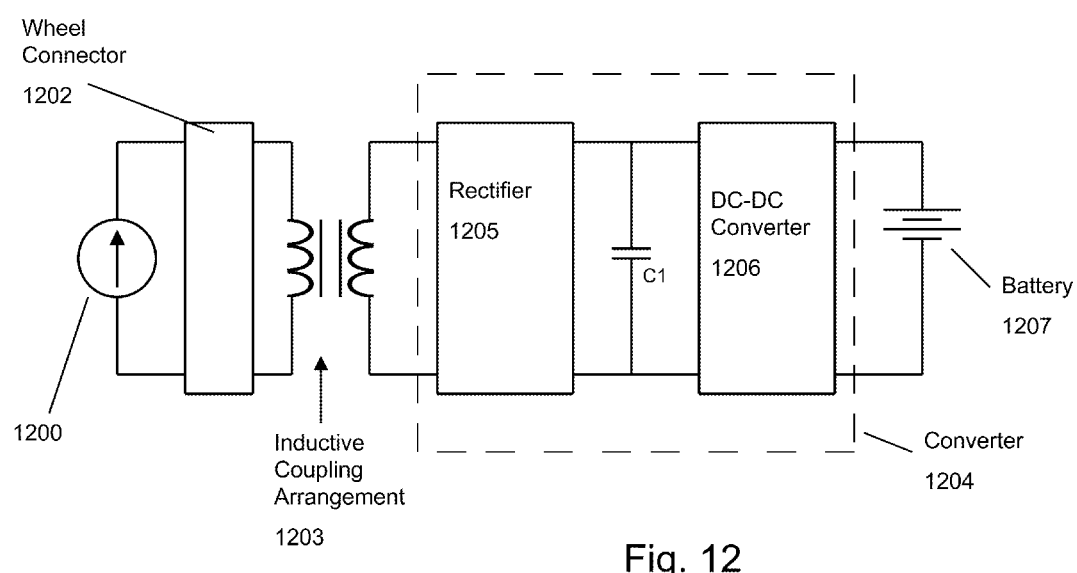
FIG. 12 depicts an example of a circuit that may include the piezoelectric ultracapacitors of the present invention.

Referring now to FIG. 12, there is depicted an embodiment of a circuit that may be used in conjunction with the piezoelectric ultracapacitors (elastomeric and otherwise) of the present invention. Circuit element 1200, depicted as a current source, represents one or more piezoelectric ultracapacitors, such as those described herein. Element 1200 is electrically connected by conductors to optional wheel connector 1202, which is itself electrically connected to an inductive coupling arrangement 1203 located on a hub assembly (not shown). Wheel connector 1202 is optional in that some embodiments may not include it, but instead have the conductors run directly to coupling circuitry. Inductive couplers are known to the art and have been used where it is advantageous to transmit electrical energy without a direct electrical connection. While not necessary to the invention, "contactless" energy transmission is desirable in this context because the tires of the automobile are in circular motion relative to the body of the automobile and, therefore, relative to the battery and motor. Such an inductive coupler may, for example, comprise two coils of wire placed in close proximity to each other. One such coil may be affixed to the hub assembly of the wheel (not shown) and the other affixed to a portion of the suspension of the automobile, such as the steering knuckle (also not shown). It is important to place the coils as closely together as possible in order to limit leakage of the magnetic flux, preferably within about 4-5 mm. In such an embodiment, the electrodes of element 1200 are connected to the first coil by conductors that are formed within the tire under the cap plies and are thereby connected to the hub assembly coil. The coil formed on the steering knuckle is connected via inductance to the first coil, and by electrical conductors to the conversion circuitry 1204, which is located wherever is convenient in the engine, but preferably near the battery 1207. Various other prior art inductive coupling arrangements that may be used with the present invention are described in U.S. Pat. No. 6,301,128 to Jang et al., the entire contents of which is hereby incorporated by reference for all purposes. A "contact-full" brush connection, instead of the inductive coupling arrangement 1203, may also be employed.

Conversion circuitry 1204 is shown as comprising a rectifier 1205, a filter capacitor C1 and a DC-DC converter 1206, all connected in parallel and configured to convert the power delivered from the coupler to a form more suitable for storage in the battery 1207. Battery 1207 may comprise a rechargeable battery of various forms know to the art, including lithium polymer rechargeable batteries. Alternatively, power from the converter may be transmitted directly to the engine/motor of the automobile, without first being stored in the battery. Those of ordinary skill in the art will understand that, in such an embodiment, the conversion circuit must be configured to that the electrical power output from it is in a form suitable to the input of the engine/motor.

The invention claimed is:

1. A device comprising a piezoelectric element coupled to an electrode coupled to an elastomer material, wherein said piezoelectric element includes a first face and a second face and said electrode is disposed opposite said second face and electrically coupled to said first face.

2. The device of claim 1 wherein said piezoelectric element and said elastomer material are disposed between said electrode and an opposing electrode.

3. The device of claim 1 wherein said piezoelectric element is coupled to a first accumulation of an electrolyte material.

4. The device of claim 1 wherein said electrode comprises a compliant electrode.

5. The device of claim 4 wherein said compliant electrode is formed as part of said elastomer material.

6. The device of claim 1 further comprising an output circuit.

7. The device of claim 1 further comprising a second electrode and wherein either of said electrode or said second electrodes comprises a compliant electrode.

8. A device comprising a piezoelectric element coupled to an electrode coupled to an elastomer material, wherein said an accumulation of an electrolyte material is disposed between said electrode and said piezoelectric element.

9. A device comprising a piezoelectric element having a first face and a second face, wherein said second face is coupled to a first electrode opposite said first face and said first electrode is coupled to a first elastomer element and further comprising an electrolyte disposed between a face of said piezoelectric element and an electrode.

10. The device of claim 9 further comprising a second elastomer element coupled to a second electrode opposite said second face.

11. The device of claim 9 wherein said first electrode comprises a compliant electrode.

12. The device of claim 9 further comprising a second electrode and wherein either of said first or second electrodes comprises a compliant electrode.

13. The device of claim 9 wherein said first elastomer element is disposed between said first electrode and a second electrode.

14. The device of claim 9 further comprising an energy storage circuit.

15. A device comprising a piezoelectric core having a first surface and a second surface, wherein said second surface is electrically coupled to a first conductor means opposite said first surface, said device further including a first electrolyte elastomer element between said first conductor means and said first surface.

16. The device of claim 15 further including a second electrolyte elastomer element between said second conductor means and said second surface.

17. The device of claim 15 wherein said first conductor means comprises a compliant electrode.

18. The device of claim 17 wherein said compliant electrode is formed as part of said elastomer element.

19. The device of claim 15 further comprising an energy storage means.

20. The device of claim 7 wherein either of said electrode or said second electrodes is formed as part of an elastomer material.

* * * * *